United States Patent [19]

Dorsemagen et al.

[11] 4,151,568
[45] Apr. 24, 1979

[54] CIRCUIT ARRANGEMENT FOR THE SLOW, CONSTANT FORWARD OR REVERSE MOVEMENT OF THE WRITE/READ HEADS IN A CYLINDER MEMORY

[75] Inventors: Stephan Dorsemagen, Munich; Hermann Eiting, Unterpfaffenhofen, both of Fed. Rep. of Germany

[73] Assignee: Siemens Aktiengesellschaft, Berlin & Munich, Fed. Rep. of Germany

[21] Appl. No.: 805,642

[22] Filed: Jun. 13, 1977

[30] Foreign Application Priority Data

Jul. 28, 1976 [DE] Fed. Rep. of Germany ....... 2633924

[51] Int. Cl.$^2$ ............................................... G11B 5/56
[52] U.S. Cl. .................................................... 360/75
[58] Field of Search ................................. 360/75–77, 360/105, 106, 109, 135

[56] References Cited
U.S. PATENT DOCUMENTS

| 3,427,606 | 2/1969 | Black et al. | 360/77 |
| 3,812,533 | 5/1974 | Kimura et al. | 360/77 |
| 3,994,016 | 11/1976 | Moghadam | 360/77 |

Primary Examiner—John H. Wolff
Attorney, Agent, or Firm—Hill, Gross, Simpson, Van Santen, Steadman, Chiara & Simpson

[57] ABSTRACT

A circuit arrangement provides a slow, constant forward or reverse movement of the write/read heads in a cylinder memory and includes a regulating circuit which comprises a track difference register, a digital-/analog converter connected to the track difference register, an arrangement for providing a sign for the analog signal, and a function generator for receiving the analog signal. In the digital portion of the regulating circuit one or more of the low-value bits is activated in order to produce a slow, constant speed of the write/-read heads.

4 Claims, 1 Drawing Figure

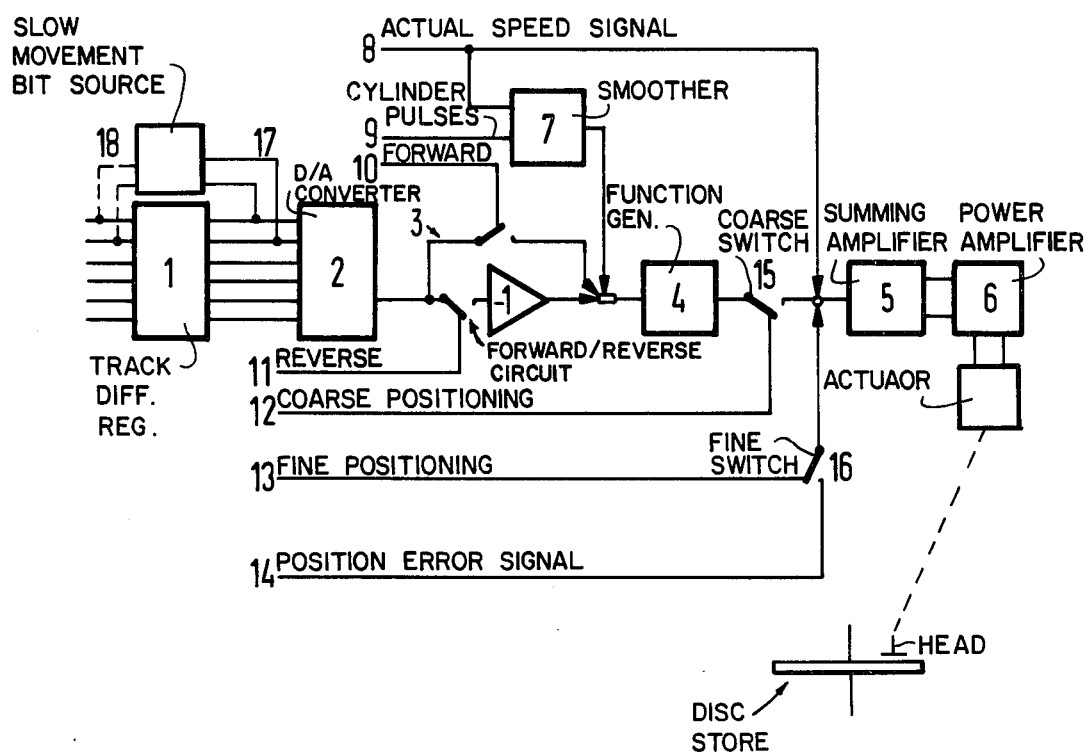

CIRCUIT ARRANGEMENT FOR THE SLOW, CONSTANT FORWARD OR REVERSE MOVEMENT OF THE WRITE/READ HEADS IN A CYLINDER MEMORY

BACKGROUND OF THE INVENTION

1. Field of the Invention

The present invention relates to a circuit arrangement for providing a slow, constant forward/reverse movement of the write/read heads in a cylinder memory, and more particularly to such an arrangement in association with a regulating circuit which comprises a track difference register, a digital/analog coverter connected to the register and an arrangement for providing a sign to the analog signal, and a function generator for receiving the analog signal.

2. Description of the Prior Art

A positioning system for the write/read heads of a cylinder memory must fulfill two basic functions. First of all the system must be able to find new data tracks in the shortest possible time and, secondly, the system must be able to precisely position the heads on the data tracks during a reading process or a writing process.

Therefore, conventionally two regulating circuits have been provided, i.e. a coarse regulating circuit intermeshed with a fine regulating circuit. The coarse regulating circuit contains a path-dependent speed control of the positioning unit, and the path to be traveled to the new target track is stored, as a binary track difference (cylinder difference) in a difference register. The track difference register is caused to count backward with the cylinder pulses of the intersecting tracks. A digital/analog converter produces an analog value from the particular digital value. Depending upon the position of the target track, the analog value is then provided, by way of a forward/reverse circuit, with an appropriate sign, and with the aid of a function generator is distorted to form the theoretical speed signal. At the input of a summing amplifier the theoretical speed signal and the actual speed signal are compared with one another, the difference is amplified, and the amplified difference is fed to a power amplifier which operates the positioning device. A so-called "smoother" serves, in a manner well known in the art, to smooth the output function of the digital/analog converter.

The fine regulation system is responsible for the position of the data heads on the theoretical track. It is activated as soon as the difference register is caused to count back to zero at the end of a positioning process. Here, the regulating value "path" is represented by the analog position error signal. In modern disc memories, the signal is derived from a special servo surface of the stack of discs. The position error signal is amplified in the summing amplifier and, by way of the power amplifier, causes the positioning drive unit to move in the direction in which the error signal becomes zero.

In addition to the two above described basic functions, the position regulating device of a cylinder memory must also handle a series of subsidiary functions including the function of "slow, constant forward and/or backward movement of the write/read heads".

In known cylinder memories, special digital/analog circuits which supply a constant theoretical speed value are provided for the slow forward/reverse movement. As it is also necessary to provide a sign formation for both directions of movement, the expense for such additional circuitry is considerable.

SUMMARY OF THE INVENTION

Therefore, the primary object of the present invention is to provide a circuit arrangement of the type generally referred to above, with which the expense can be substantially reduced.

According to the invention, the above object is achieved in that for the production of the slow, constant speed, one or more of the least significant bits are activated in the digital portion of the coarse regulating circuit. The digital theoretical speed value then passes by way of the digital/analog converter, the forward/reverse circuit and the function generator to the summing point with the actual speed. As a result of such a design of a circuit arrangement, according to the invention, for the slow, constant forward/reverse movement of the write/read heads, the expense is virtually reduced to zero in comparison with arrangements heretofore known.

BRIEF DESCRIPTION OF THE DRAWING

Other objects, features and advantages of the invention, its organization, construction and operation will be best understood from the following detailed description of a preferred embodiment thereof, taken in conjunction with the accompanying drawing, on which there is a single schematic representation of a circuit arrangement constructed in accordance with the present invention.

DESCRIPTION OF THE PREFERRED EMBODIMENTS

Referring to the drawing, the fundamental components of a position regulating device for a cylinder memory is illustrated and includes the circuit arrangement of the present invention. The device comprises a track difference register, in which the path to be traveled to the new target track is stored as a binary track difference. The difference register 1 is caused to count backward in a known manner by the cylinder pulses of the intersecting tracks of the disc memory. A digital/analog converter 2 is connected to the output of the difference register 1 and produces an analog value from the digital value stored in the difference register 1. Depending upon the position of the target track, the analog value is provided with an appropriate sign in a forward/reverse circuit 3, and with the aid of a following function generator 4 is distorted, in a known manner, to form the theoretical speed signal. At the input of a summing amplifier 5, the theoretical speed signal and the actual speed signal are compared with one another, the difference therebetween is amplified, and the amplified difference is fed to a power amplifier for actuating the positioning drive. The actual speed signal is supplied to the summing amplifier 5 by way of line 8. A smoothing integrator 7 also receives the actual speed signal present on the line 8 and the cylinder pulses which are present on the line 9. The device 7 serves to smooth the output function of the digital/analog converter 2 at the input of the function generator 4. A signal is supplied on the line 10 when a positioning in the reverse direction is to be effected, and another signal is supplied on the line 11 when a positioning in the forward direction is to occur.

In addition to the coarse regulating circuit comprising the elements 1, 2, 3, 4 and 7, the position regulating device also contains a fine regulating circuit which is activated as soon as the difference register 1 is reset to zero at the end of a positioning process. In this case, the regulating value is represented by the analog position error signal which is received on the line 14. When the position regulating device has transferred from the coarse regulating circuit to the fine regulating circuit, with the aid of signals on the lines 12 and 13 which alternately actuate two switches 15 and 16, the analog position error signal is amplified in the summing amplifier 5, and by way of the power amplifier 6, causes the positioning drive to move into that direction in which the error signal becomes zero.

According to the invention, a slow, constant speed of the read/write heads is produced by activating one or more of the least significant bits in the digital portion of the coarse regulating circuit. This can be effected by activating either one or several of the least significant bit inputs of the analog/digital converter 2 by way of the lines 17 or one or more of the least significant bits of the track difference register 1 by way of an input represented by the broken lines 18. In this manner, the positioning system is presented with a simulated constant low target range. The digital theoretical speed value passes by way of the digital/analog converter 2, the forward/reverse transfer unit 3 and the function generator 4 to the summing point with the actual speed at the input of the summing amplifier 5. By way of the path-dependent speed regulating system, this leads to a low constant speed of the system. The transfer of the movement direction does not require any additional device, as this is already provided in the form of the forward-/reverse transfer unit 3. This means that no additional expense is necessary with a circuit arrangement constructed in accordance with the present invention for the sub-function "slow travel".

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a circuit arrangement for providing a slow, constant forward or reverse movement of the write-/read heads in a disc memory which has a course regulating circuit of the type in which a track difference register stores the path to a target track as a multi-bit word in binary form, a digital/analog converter converts the content of the register into an analog signal representing the distance to the target track, a forward/reverse circuit operates to provide the analog signal with a sign representing the direction of the target track and a function generator combines the analog signal having the sign and an actual speed signal to provide a theoretical speed signal to a circuit for comparing and obtaining the difference between the actual and theoretical speed signals for operating a positioning drive, the improvement in combination therewith comprising:

means for activating at least one of the least significant digital bits of the multi-bit word either upstream or downstream of the track difference register and feeding the same to the digital/analog converter to supply an additional input to said digital-/analog converter to provide for a constant flow speed movement of the write/read heads range.

2. The improved circuit arrangement of claim 1 wherein said means activates more than one of the least significant bits.

3. The improved circuit arrangement of claim 1, wherein said means is connected to input said at least one least significant bit into the track difference register.

4. The improved circuit arrangement of claim 1, wherein said means is connected at the output-input connection between the track difference register and the digital/analog converter.

* * * * *